United States Patent
Sugihara

(10) Patent No.: US 9,329,422 B2
(45) Date of Patent: May 3, 2016

(54) LAMINATION SUBSTRATE AND MANUFACTURING METHOD OF THE SAME

(71) Applicant: JVC KENWOOD Corporation, Yokohama-shi (JP)

(72) Inventor: Masato Sugihara, Yokohama (JP)

(73) Assignee: JVC KENWOOD Corporation, Yokohama-shi (JP)

( * ) Notice: Subject to any disclaimer, the term of this patent is extended or adjusted under 35 U.S.C. 154(b) by 0 days.

(21) Appl. No.: 14/631,380

(22) Filed: Feb. 25, 2015

(65) Prior Publication Data

US 2015/0177558 A1 Jun. 25, 2015

Related U.S. Application Data

(63) Continuation of application No. PCT/JP2013/073216, filed on Aug. 29, 2013.

(30) Foreign Application Priority Data

Aug. 30, 2012 (JP) .................................. 2012-190294

(51) Int. Cl.
| | | |
|---|---|---|
| *H05K 1/03* | (2006.01) | |
| *G02F 1/1333* | (2006.01) | |
| *B32B 37/12* | (2006.01) | |
| *B32B 37/18* | (2006.01) | |

(Continued)

(52) U.S. Cl.
CPC ...... *G02F 1/133351* (2013.01); *B32B 37/1284* (2013.01); *B32B 37/18* (2013.01); *B32B 38/0004* (2013.01); *B32B 38/10* (2013.01); *H01L 21/78* (2013.01); *B32B 2457/202* (2013.01); *G02F 2202/28* (2013.01)

(58) Field of Classification Search
CPC .................................................. G02F 1/133351
USPC .......................................................... 174/255
See application file for complete search history.

(56) References Cited

U.S. PATENT DOCUMENTS

| | | | | |
|---|---|---|---|---|
| 6,271,102 B1 * | 8/2001 | Brouillette | ........... | B23D 59/002 257/E21.518 |
| 6,303,462 B1 * | 10/2001 | Gidon | .................. | H01L 21/762 257/E21.545 |

(Continued)

FOREIGN PATENT DOCUMENTS

| | | |
|---|---|---|
| JP | 05-249441 | 9/1993 |
| JP | 09-101529 | 4/1997 |

(Continued)

OTHER PUBLICATIONS

International Search Report in PCT International Application No. PCT/JP2013/073216, dated Nov. 12, 2013.

*Primary Examiner* — Sherman Ng
(74) *Attorney, Agent, or Firm* — Venable LLP; Michael A. Sartori; Todd R. Farnsworth

(57) ABSTRACT

A manufacturing method according to an embodiment of the present invention includes: a step of forming a tapered first groove on a surface of a semiconductor wafer; a step of forming a notch groove having a narrow width in a bottom portion of the first groove; a step of laminating the semiconductor wafer to a mother glass substrate using a sealing material; a step of forming a tapered second groove on a back surface of the semiconductor wafer; a step of separating a semiconductor substrate of the semiconductor wafer by cutting the semiconductor wafer from the second groove toward the notch groove; and a step of separating respective counter substrates by cutting the mother glass substrate along a scribe groove.

2 Claims, 7 Drawing Sheets

(51) Int. Cl.
*B32B 38/00* (2006.01)
*B32B 38/10* (2006.01)
*H01L 21/78* (2006.01)

(56) References Cited

U.S. PATENT DOCUMENTS

2006/0223234 A1* 10/2006 Terayama ........... H01L 21/6836
 438/113

2008/0171209 A1* 7/2008 Nishiyama .............. B32B 17/06
 428/428

FOREIGN PATENT DOCUMENTS

| JP | 09-141646 | 6/1997 |
| JP | 2007-057638 | 3/2007 |
| WO | WO-2011/132445 | 10/2011 |

* cited by examiner

LAMINATION SUBSTRATE AND MANUFACTURING METHOD OF THE SAME

CROSS-REFERENCE TO RELATED APPLICATION(S)

This application is a continuation of International Application No. PCT/JP2013/073216, filed on Aug. 29, 2013 which claims the benefit of priority of the prior Japanese Patent Application No. 2012-190294, filed on Aug. 30, 2012, the entire contents of which are incorporated herein by reference.

BACKGROUND OF THE INVENTION

1. Field of the Invention

The present invention relates to a lamination substrate and a manufacturing method.

2. Description of the Related Art

A liquid crystal display element has a structure in which a liquid crystal is held between a first substrate and a second substrate. The first substrate and the second substrate are laminated together using a sealing material. The liquid crystal is sealed in a space formed by the first substrate, the second substrate, and the sealing material. In an active matrix type liquid crystal display element, the first substrate is a thin film transistor (TFT) array substrate, and the second substrate is a counter substrate.

In a method of manufacturing a liquid crystal display element, a plurality of TFT array substrates is formed on a first mother substrate, and a plurality of counter substrates is formed on a second mother substrate. Then, the first and second mother substrates are cut, and whereby each of the TFT array substrates and the counter substrates is cut off.

Japanese Laid-open Patent Publication No. 9-141646 discloses a processing method for cutting a substrate of a liquid crystal display element. In the method of Japanese Laid-open Patent Publication No. 9-141646, a groove having a V-shaped cross section is formed on both surfaces of a base substrate (mother substrate) using a dicing blade (paragraph 0028). A out groove is formed along the V groove, and whereby the base substrate is cut. As a result, an individual piece substrate including a chamfered portion can be obtained.

However, in the method of Japanese Laid-open Patent Publication No. 9-141646, a base substrate is cut before substrates are laminated together. This makes it necessary to perform lamination for each individual piece substrate, and therefore, it is difficult to obtain a high productivity. A problem of a manufacturing method in which cutting is performed after first and second mother substrates are laminated together will be described below with reference to FIGS. 11 and 12. FIGS. 11 and 12 are cross-sectional views of steps of manufacturing a liquid crystal display element.

As illustrated in FIG. 11, a semiconductor wafer 110 and a mother glass substrate 120 are laminated together using a sealing material 130. The semiconductor wafer 110 includes a plurality of semiconductor substrates 100. FIG. 11 illustrates a structure in which the semiconductor wafer 110 includes two semiconductor substrates 100. The mother glass substrate 120 includes a plurality of counter substrates 101. FIG. 11 illustrates a structure in which the mother glass substrate 120 includes two counter substrates 101. A lamination substrate in which the send conductor substrate 100 and the counter substrate 101 are laminated together becomes a liquid crystal display element. The sealing material 130 is provided for each liquid crystal display element.

A liquid crystal 140 is sealed in a space formed by the semiconductor substrate 100, the counter substrate 101, and the sealing material 130. A terminal 113 for driving the liquid crystal 140 and a pixel electrode 111 are formed in the semiconductor substrate 100. First, the semiconductor wafer 110 is cut while the semiconductor wafer 110 and the mother glass substrate 120 are laminated together. That is, a notch groove 150 is formed between the semiconductor substrates 100 adjacent to each other.

Next, a scribe groove 160 is formed on a surface of the mother glass substrate 120 not facing the semiconductor wafer 110. As illustrated in FIG. 12, the lamination structure is disposed on a breaker stage 170 made of rigid urethane. A breaker squeegee 171 is disposed just above the scribe groove 160. Then, the breaker squeegee 171 is pushed in a direction of the mother glass substrate 120. As a result, the mother glass substrate 120 can be cut.

However, when the breaker squeegee 171 is pushed into the semiconductor substrate 100, the mother glass substrate 120 is pushed into the breaker stage 170. At this time, as illustrated in FIG. 12, the breaker stage 170 is deformed. By contact of the semiconductor substrate 100 with the mother glass substrate 120, corner portions of the semiconductor substrate 100 and the counter substrate 101 may be damaged (contact portion 181 in FIG. 12). In addition, by contact between the semiconductor substrates 100 adjacent to each other, the corner portions of the semiconductor substrate 100 may be damaged (contact portion 180 in FIG. 12). As described above, when the semiconductor substrate 100 or the counter substrate 101 is damaged, a fragment affects the terminal 113 or a circuit around the terminal 113. As a result, circuit failure or contact point failure of a connection terminal may be caused. Therefore, a yield may be lowered to degrade productivity.

In view of the above-described problem, an object of the present invention is to provide a lamination substrate having a high productivity and a method of manufacturing the lamination substrate.

SUMMARY OF THE INVENTION

It is an object of the present invention to at least partially solve the problems in the conventional technology.

There is provided a manufacturing method for manufacturing a lamination substrate in which a first substrate part and a second substrate part are laminated together using a first mother substrate including a plurality of first substrate parts and a second mother substrate including a plurality of second substrate parts, the manufacturing method includes a step of forming the first substrate part including a terminal in the first mother substrate; a step of forming a tapered first groove on a first surface provided with the terminal of the first mother substrate; a step of forming a notch groove having a width narrower than the maximum width of the first groove in a bottom portion of the first groove; a step of providing an adhesive in at least one of the first substrate part and the second substrate part; a step of laminating the first mother substrate to the second mother substrate using the adhesive such that the first surface is disposed on the side of the second mother substrate and the terminal is disposed outside the adhesive; a step of forming a tapered second groove at a position corresponding to the first groove on a second surface opposite to the first surface of the first mother substrate; a step of separating the respective first substrate parts by cutting the first mother substrate from the second groove toward the notch groove; a step of providing a scribe groove on a surface of the second mother substrate not facing the first substrate part; and a step of separating the respective second substrate parts by cutting the second mother substrate along the scribe groove.

There is also provided a lamination substrate that includes a first substrate; a second substrate disposed to face a first surface of the first substrate; an adhesive disposed between the first substrate and the second substrate to laminate the first substrate and the second substrate together; and a terminal formed on the side of the first surface of the first substrate and disposed outside the adhesive, wherein a side end surface of the first substrate includes: a first chamfered portion provided on the side of the first surface; a second chamfered portion provided on the side of a second surface opposite to the first surface and having a depth in a thickness direction of the first substrate different from that of the first chamfered portion; and a cut surface disposed between the first chamfered portion and the second chamfered portion, the length of the first substrate in a direction perpendicular to the thickness direction is the same as that of the second substrate, and a side end of the second substrate is disposed between the terminal and the adhesive closer to the terminal, wherein the first substrate and the second substrate have a same length respectively in the direction perpendicular to the thickness direction, and the side end of the second substrate is disposed between the terminal and the adhesive closer to the terminal.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment of the present invention will be described with reference to the drawings. In the description below, it is assumed that a lamination substrate according to the present embodiment is a liquid crystal display element. Of course, the lamination substrate according to the present embodiment is not limited to the liquid crystal display element. The lamination substrate according to the present embodiment may be a display element, an optical element, a semiconductor substrate or the like other than the liquid crystal display element, or may be something other than these. That is, the lamination substrate according to the present embodiment can be applied to a lamination substrate having a structure in which a first substrate and a second substrate are laminated together using an adhesive. Materials of the first substrate and the second substrate are not particularly limited. It is possible to use a material suitable for a lamination substrate in which one substrate is cut by scribe break.

A semiconductor wafer is prepared, the semiconductor wafer including a plurality of semiconductor substrates as a first substrate part. In a case of an active matrix type liquid crystal display element, the semiconductor substrate is a TFT array substrate. Similarly, a mother glass substrate is prepared, the mother glass substrate including a plurality of counter substrates as a second substrate part.

In the present embodiment, after the semiconductor wafer and the mother glass substrate are laminated together, the semiconductor wafer is cut into an element size. The semiconductor wafer as a first mother substrate is cut, and whereby the plurality of semiconductor substrates provided in the semiconductor wafer is separated into individual pieces. After the semiconductor wafer is cut, the mother glass substrate is cut into an element size. The mother glass substrate as a second mother substrate is cut, and whereby the plurality of counter substrates provided in the mother glass substrate is separated into individual pieces. As a result, the liquid crystal display element including the semiconductor substrate and the counter substrate can be manufactured. Curing of a sealing material, dropping of a liquid crystal, or the like can be performed in a mother substrate before cutting. Therefore, productivity can be enhanced.

When a reflection type liquid crystal display element is manufactured, a silicon wafer can be used as a semiconductor wafer. The semiconductor wafer is provided with a reflection pixel electrode such as an aluminum film. Of course, the following manufacturing method can be also applied to liquid crystal display elements other than the reflection type liquid crystal display element. That is, the following manufacturing method can be also applied to a transmission type liquid crystal display element. One of a pair of substrates which are disposed so as to face each other is required at least to be subjected to scribe break.

Figure 1:
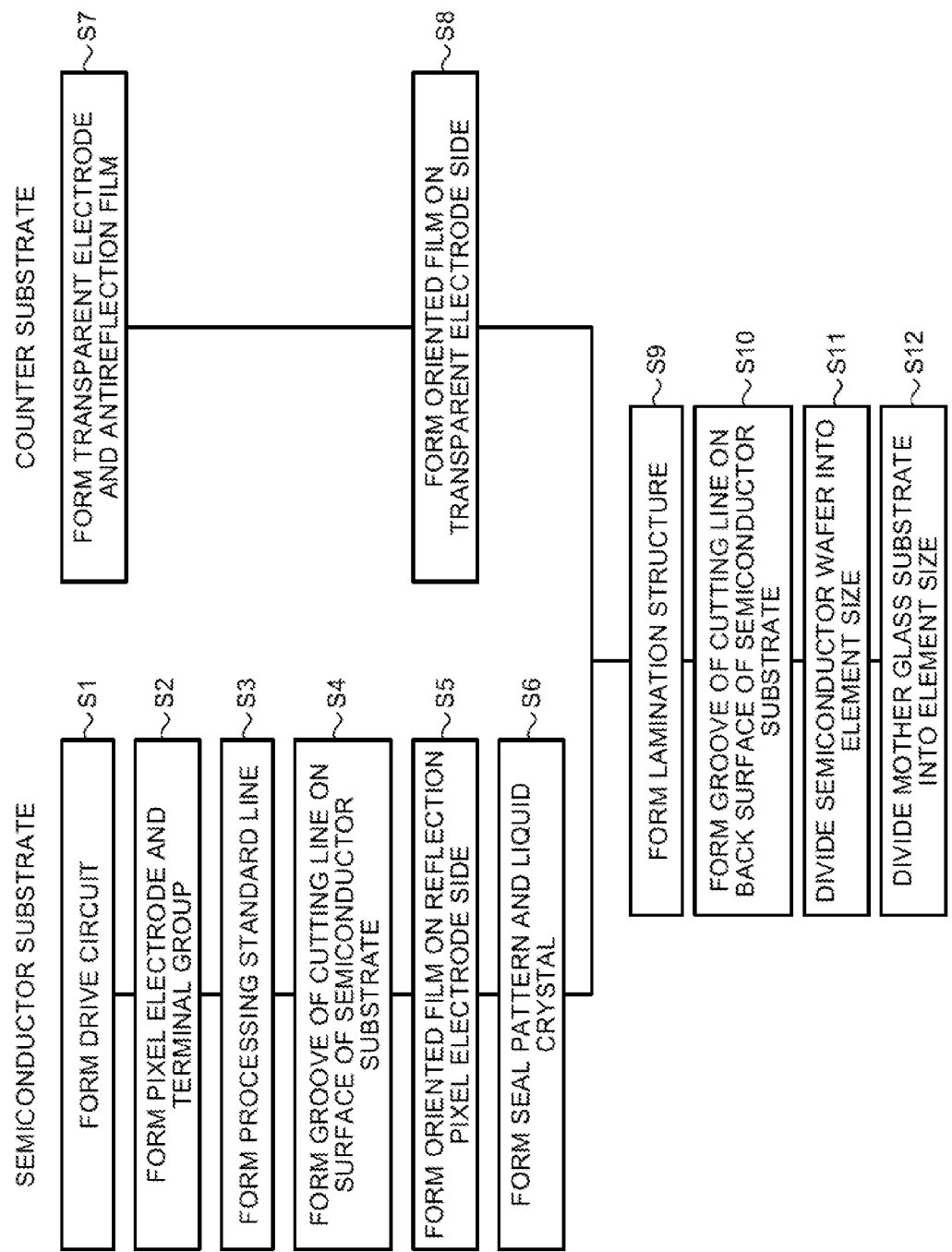
FIG. 1 is a flowchart illustrating a method of manufacturing a lamination substrate according to the present embodiment.
Figure 2:
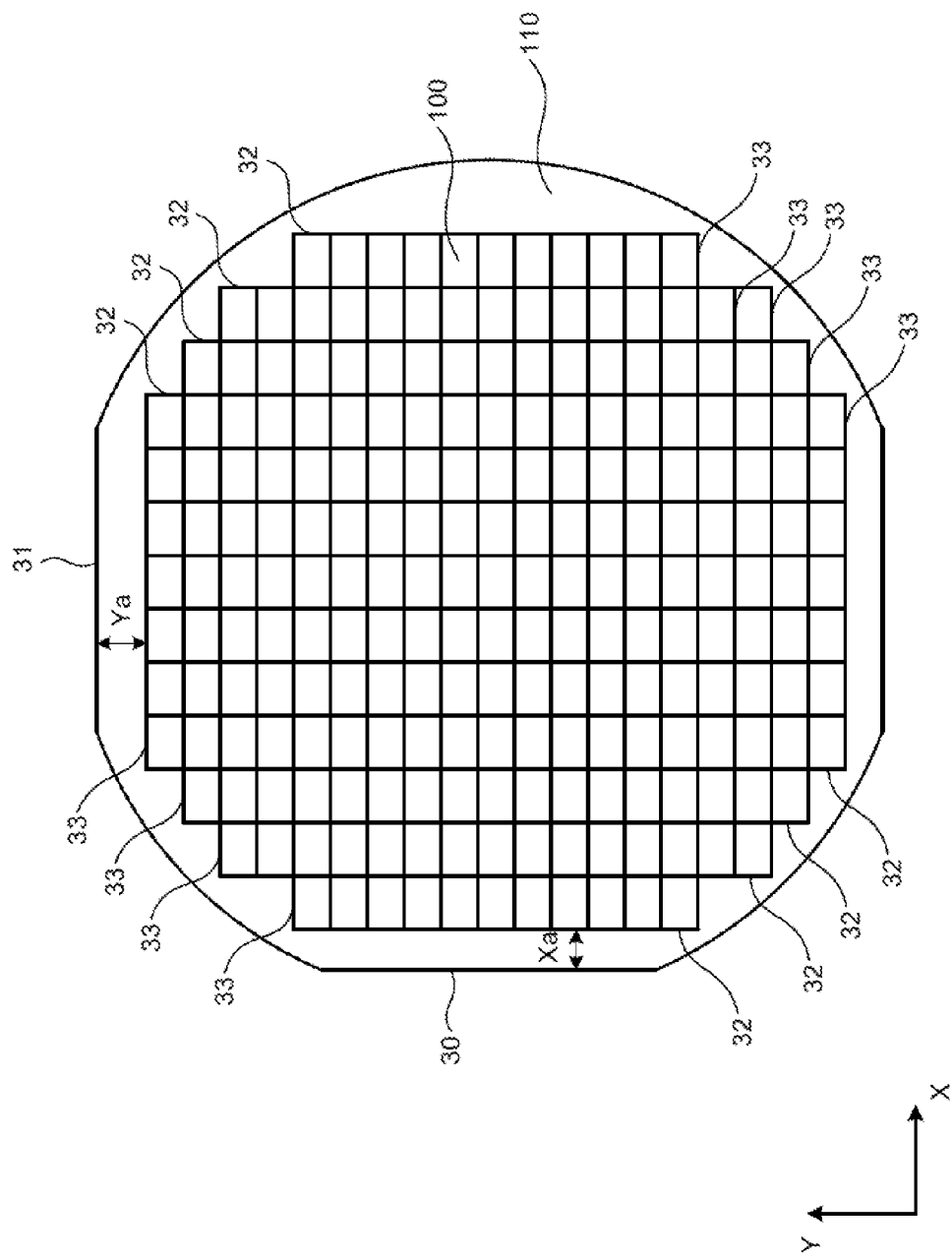
FIG. 2 is a plan view illustrating a semiconductor wafer in which a plurality of semiconductor substrates is formed.

The lamination substrate and a method of manufacturing the same according to the present embodiment will be described with reference to the drawings. FIG. 1 is a flowchart illustrating a manufacturing method. The manufacturing flow illustrated in FIG. 1 will foe described with reference to FIGS. 2 to 9 if necessary. FIG. 2 is a plan view illustrating a structure of a semiconductor wafer including a plurality of semiconductor substrates. Each of FIGS. 3 to 9 is a step cross-sectional view in the middle of manufacturing. The order of the manufacturing steps described below can foe changed if necessary.

(Step S1: Step of Forming Drive Circuit)

First, a manufacturing step on the side of a semiconductor wafer 110 will foe described. The semiconductor wafer 110 is, for example, a silicon wafer of eight inches. A drive circuit (not illustrated in the figures) is formed near a surface of the semiconductor wafer 110 using a predetermined semiconductor process. The drive circuit is a circuit to drive a liquid crystal, and includes TFT or the like. The drive circuit is formed for each predetermined region. Here, the predetermined region corresponds to one liquid crystal display element. That is, the drive circuit is formed for each liquid crystal display element (predetermined region) on a surface of a semiconductor substrate 100.

As illustrated in FIG. 2, the semiconductor wafer 110 includes a plurality of semiconductor substrates 100 arranged in a matrix shape. In a step described later, the semiconductor wafer 110 is cut along separation lines 32 and 33, and whereby the semiconductor substrates 100 are divided into individual pieces. As a result, the liquid crystal display element includes one semiconductor substrate 100. A drive circuit is formed for each semiconductor substrate 100. In a case of an active matrix type liquid crystal display element, the semiconductor substrate 100 is a TFT array substrate in which TFTs are arranged in a matrix shape.

(Step S2: Step of Forming Pixel Electrode and Terminal Group)

Figure 3:
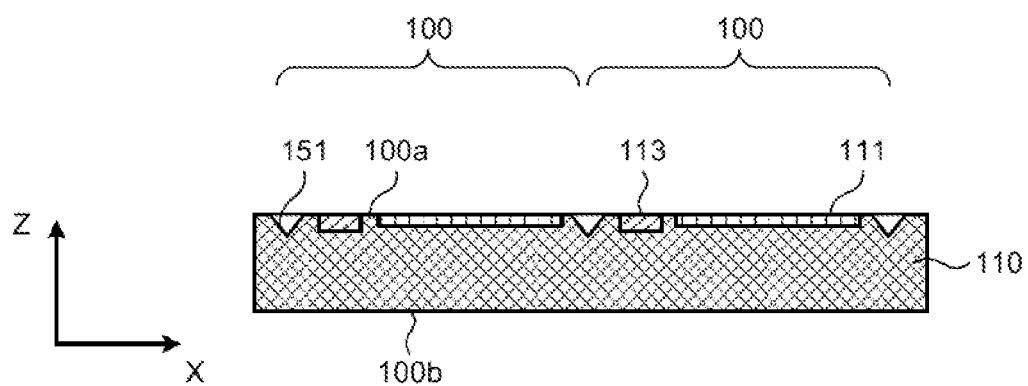
FIG. 3 is a step cross-sectional view of the lamination substrate in the manufacturing method according to the present embodiment.

A plurality of pixel electrodes 111 and a plurality of terminals 113 arranged in a matrix shape are formed for each predetermined region (refer to FIG. 3) on a surface 100a of the semiconductor wafer 110. The plurality of pixel electrodes 111 and the plurality of terminals 113 are provided in each semiconductor substrate 100. FIG. 3 illustrates two of the plurality of semiconductor substrates 100 provided in the semiconductor wafer 110, and the pixel electrode 111 and the terminal 113 are formed in each semiconductor substrate 100.

In each semiconductor substrate 100, a region where the pixel electrode 111 is provided is a display region. The pixel electrode 111 is provided for each of the plurality of pixels, but the pixel electrode 111 is simplified in the figures. The terminal 113 is a connection terminal to be connected to the outside, and is formed in a peripheral region outside the display region. Furthermore, various wires extend from the terminal 113. The plurality of terminals 113 is provided depending on the number of input signals or the like, but simplified in the figures. The terminals 113 are typically arranged along an edge side of the semiconductor substrate 100.

Here, a surface of the semiconductor wafer 110 and the semiconductor substrate 100 on which the pixel electrode 111 and the terminal 113 are formed is referred to as a surface 100a, and a surface opposite thereto is referred to as a back surface 100b. That is, a first surface on which the pixel electrode 111 and the terminal 113 are formed is the surface 100a, and a second surface opposite to the first surface is the back surface 100b.

In the present embodiment, an aluminum film having a thickness of 0.2 μm is formed by a sputtering method. Thereafter, a resist pattern is formed using a photolithography method. The aluminum film is etched with the resist pattern as a mask, and whereby a pattern of a conductive film that includes the pixel electrode 111 and the terminal 113 can be formed. The pixel electrode 111 is a reflection pixel electrode which reflects light.

(Step S3: Step of Forming Processing Standard Line on Back Surface)

Processing standard lines 30 and 31 are formed in the semiconductor wafer 110. As illustrated in FIG. 2, dicing is performed at a position of an offset amount Xa from a left end of a pattern region in the semiconductor wafer 110. As a result, the processing standard line 30 in a Y direction can be formed. Similarly, dicing is performed at a position of an offset amount Ya from an upper end of the pattern region. In this way, the processing standard line 31 in an X direction can be formed.

The pattern region is a region in which a pattern of the surface 100a of the semiconductor substrate 100 is formed, and a region in which the semiconductor substrate 100 is formed. End parts of the semiconductor wafer 110 are cut based on the pattern region, and whereby the processing standard lines 30 and 31 are formed in the end parts of the semiconductor wafer 110. The processing standard lines 30 and 31 are cutting lines obtained when the end parts of the circular semiconductor wafer 110 are cut. The processing standard lines 30 and 31 are standard lines used for alignment when the semiconductor wafer 110 is processed in later steps (S4, S10, S11).

Of course, the order of forming the processing standard lines 30 and 31 is not particularly limited. The processing standard lines 30 and 31 are each provided only at one end of the semiconductor wafer 110, but the processing standard lines 30 and 31 may each be provided at both ends of the semiconductor wafer 110. In this case, the processing standard lines 30 are formed at left and right ends of the semiconductor wafer 110, and the processing standard lines 31 are formed at upper and lower ends of the semiconductor wafer 110.

(Step S4: Step of Forming Groove of Cutting Line)

A first groove 151 is formed on cutting lines 32 and 33 of the semiconductor wafer 110. As illustrated in FIG. 3, the first groove 151 is formed on the surface 100a of the semiconductor wafer 110. In the present embodiment, the first groove 151 is formed before a lamination step (step S9). The first groove 151 has a tapered shape. The tapered shape is a cross-sectional shape in which the width on the side of the surface 100a is the widest and the width becomes narrower toward a deeper position of the groove. Here, as illustrated in FIG. 3, the first groove 151 has a V-shaped cross-section. That is, the first groove 151 is a V-groove. For example, an angle at a bottom portion of the V-groove is 60 degrees or more and 90 degrees or less.

The first groove 151 is formed on the cutting lines 32 and 33 which are boundaries between the semiconductor substrates 100 adjacent to each other (FIG. 2). The cutting line 32 is formed in the Y direction, and the cutting line 33 is formed in the X direction. As a result, the first grooves 151 are formed in a lattice shape at a predetermined pitch.

The first groove 151 is formed between the terminal 113 of the semiconductor wafer 110 and the pixel electrode 111 of the adjacent semiconductor substrate 100. Then, in a later cutting step (S11), dicing is performed at a position of the first groove 151, and whereby the semiconductor substrates 100 are divided into individual pieces. After performing dicing of the semiconductor wafer 110, the first groove 151 becomes a chamfered portion.

The shape of the first groove 151 can be controlled by a shape of a dicing blade used and a notch depth. For example, a dicing blade having a V-shaped blade tip is used. The V-shape angle of the blade tip is from 60 degrees to 90 degrees to match the angle of the first groove 151. More specifically, a dicing blade having a blade tip in which the V-shape angle is 60 degrees is used to form the first groove 151. When the blade is repeatedly used to form the plurality of first grooves 151, the blade tip gets worn away. As the first groove 151 is formed more, the angle of the blade tip becomes wider. The blade is replaced with a new one almost when the angle of the blade tip is 90 degrees. In this way, the V-shape angle of the first groove 151 can be controlled within a range of 60 to 90 degrees. Of course, the angle of the blade tip and the angle of the first groove 151 are not limited to the above-described values.

The kerf width of the first groove 151 on the surface 100a can be from 80 to 200 μm. The kerf width of the first groove 151 represents the width of the first groove 151 on the surface 100a, and is the maximum width of the first groove 151 having a tapered shape. The kerf width is controlled by the height of the V-shaped blade. That is, the more deeply digging-in with the V-shaped blade tip is performed, the wider the kerf width can be. In addition, when the thickness of the blade is 200 μm, the maximum width of the first groove 151 can be 200 μm or less. It is assumed that the shape of the first groove 151 is such that the end surface of the semiconductor wafer 110 does not come into contact with the mother glass substrate 120 in a later dividing step (S12).

Figure 4:
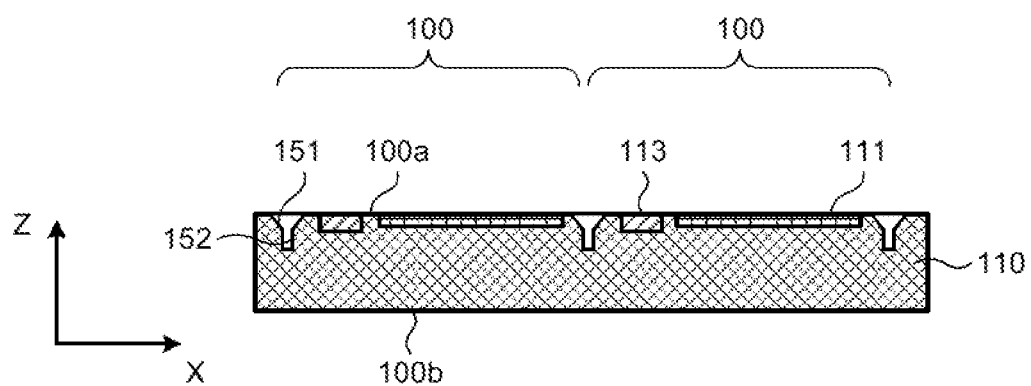
FIG. 4 is a step cross-sectional view of the lamination substrate in the manufacturing method according to the present embodiment.

Furthermore, as illustrated in FIG. 4, a notch groove 152 is formed in the bottom portion of the first groove 151. That is, the bottom portion of the first groove 151 is further cut in with the dicing blade to form the notch groove 152. The semiconductor wafer 110 is half-cut with the first groove 151 and the notch groove 152. The width of the notch groove 152 is made narrower than the kerf width of the first groove 151. In other words, the width of the notch groove 152 is narrower than the maximum width of the first groove 151.

The first groove 151 has a certain degree of width due to the V-shape angle and the kerf width. Therefore, the notch groove 152 is formed with a blade thinner than the kerf width of the first groove 151. For example, the semiconductor wafer 110 is cut in with a blade having a width of 50 μm up to a depth of about 200 μm from the surface 100a of the semiconductor wafer 110 to control the notch depth from the surface 100a. A total depth of the first groove 151 and the notch groove 152 is set to be 200 μm. As described above, by using the dicing blades having different widths, it is possible to control the first groove 151 and the notch groove 152 such that each of the first groove 151 and the notch groove 152 has a desired shape.

In addition, the angle and the depth of the first groove 151 are controlled such that the first groove 151 does not reach the terminal 113. That is, when the angle of the first groove 151 is too large, the kerf width of the first groove 151 becomes wide to reach the terminal 113. The kerf width of the first groove 151 is set depending on a distance between the terminal 113 and the center of the cutting lines 32 and 33. That is, the notch depth and the groove angle are determined depending on the distance to the terminal 113.

Furthermore, the groove depth of the first groove 151 may be changed depending on the angle of the blade. For example, as the blade is worn away to cause the angle to be wider, the groove depth is made shallower. As a result, even when the blade is worn away, the kerf width of the first groove 151 can be kept constant. When the groove depth of the first groove 151 becomes shallower, the notch depth of the notch groove 152 is controlled. As a result, the total depth of the first groove 151 and the notch groove 152 can be kept constant.

Until the notch groove 152 is reached in a later cutting step (S11), a notch is formed from a back surface 100b. At this time, it is assumed that the first groove 151 and the notch groove 152 are not affected by tolerances of the thicknesses of the semiconductor wafer 110 and the mother glass substrate 120 and the shape of the blade tip, and that the first groove 151 and the notch groove 152 do not come into contact with the surface of the mother glass substrate 120. In addition, when the notch groove 152 is too deep, handling of the semiconductor wafer 110 is difficult, and thus the semiconductor wafer 110 may be easily broken. As a result, the semiconductor wafer 110 may be damaged in a step before the semiconductor wafer 110 is laminated with the mother glass substrate 120. That is, the deeper the notch groove 152 is, the more easily the semiconductor wafer 110 is damaged during transportation. Therefore, it is only necessary for the notch groove 152 to have such a depth that the semiconductor wafer 110 is not damaged during transportation.

(Step S5: Step of Forming Oriented Film on Pixel Electrode Side)

Next, an oriented film on a pixel electrode side is formed. For this purpose, first, the semiconductor wafer 110 in which the notch groove 152 has been formed is ultrasonically washed with ultrapure water. After washing, an oriented film (not illustrated in the figures) is formed on the surface 100a of the semiconductor wafer 110 so as to cover the pixel electrode 111. The oriented film is formed for each semiconductor substrate 100. The oriented film is formed at least in the display region. The oriented film is formed based on the above-described processing standard lines 30 and 31.

A $SiO_2$ film having a thickness of 0.1 μm is formed by an oblique deposition method, and whereby the oriented film can be provided. Furthermore, a mask to selectively form the oriented film is used such that the oriented film does not cover the terminal 113. That is, the oriented film is deposited while the terminal 113 is masked. This can prevent the terminal 113 from being covered with the oriented film. When the pixel electrode 111 and the terminal 113 are formed, an alignment pattern to align and form the oriented film may be formed in advance.

(Step S6: Step of Forming Seal Pattern and Liquid Crystal)

Next, a pattern of a sealing material 130 and a liquid crystal are formed. For this purpose, first, the sealing material 130 is applied on the surface 100a of the semiconductor wafer 110 that has undergone Steps S1 to S5 described above (refer to FIG. 5). The sealing material 130 is formed into a frame shape so as to surround the pixel electrode 111 of each semiconductor substrate 100. For example, when the display region is a rectangle, the sealing material 130 is applied in a rectangle-frame shape.

A region surrounded by the sealing material 130 is the display region. The terminal 113 is disposed in a peripheral region outside the sealing material 130. In the sealing material 130, a spherical spacer (not illustrated in the figures) having a predetermined diameter is dispersed in a resin. For example, the particle diameter of the spacer can be from 1 to 3 μm in accordance with the thickness of the liquid crystal layer. A gap between the substrates is controlled by the diameter of the spacer. The resin is a photocurable resin or a thermosetting resin.

Next, the liquid crystal 140 is dropped in a region surrounded by the sealing material 130. That is, for each semiconductor substrate 100, the liquid crystal 140 is dropped in the display region in which the pixel electrode 111 is formed. The liquid crystal 140 is oriented in a predetermined direction by the oriented film provided on the surface 100a of the semiconductor wafer 110. The sealing material 130 and the liquid crystal 140 may be formed on the side of the mother glass substrate 120 instead of being formed on the side of the semiconductor wafer 110. That is, it is only necessary for the liquid crystal 140 to be dropped in the region surrounded by the sealing material 130 after the sealing material 130 is formed in the semiconductor wafer 110 and/or the mother glass substrate 120.

(Step S7: Step of Forming Transparent Electrode and Antireflection Film)

Next, a manufacturing step of the counter substrate 101 will be described. The counter substrate 101 can be manufactured in parallel with the manufacturing steps of S1 to S5 described above. First, the transparent mother glass substrate 120 is prepared. The mother glass substrate 120 has a circular shape having approximately the same size as the semiconductor wafer 110. Then, a transparent electrode (not illustrated in the figures) is formed on one surface of the mother glass substrate 120, and an antireflection film (not illustrated in the figures) is formed on the other surface. Here, an ITO film having a thickness of 0.08 μm is used as the transparent electrode. The ITO film is formed with a sputtering method on an entire surface of the mother glass substrate 120. A laminated film of $Nb_2O_2$ and $SiO_2$ having a thickness of 0.3 μm can be used as the antireflection film. For example, the laminated film is formed on the other surface of the glass substrate with a vacuum deposition method to provide the antireflection film.

(Step S8: Step of Forming Oriented Film on Transparent Electrode Side)

Next, an oriented film on a transparent electrode side is formed. For this purpose, first, the mother glass substrate 120 that has undergone the steps described above is ultrasonically washed with ultrapure water. After washing, the oriented film (not illustrated in the figures) is formed on the transparent electrode. Here, the oriented film can be formed in a similar manner to step S5. That is, a mask to selectively form the oriented film is used to form a $SiO_2$ film having a thickness of 0.1 μm. The $SiO_2$ film is formed with an oblique deposition method. As a result, the oriented film can be formed on one surface of the mother glass substrate 120.

(Step S9: Step of Forming Lamination Structure)

Figure 5:
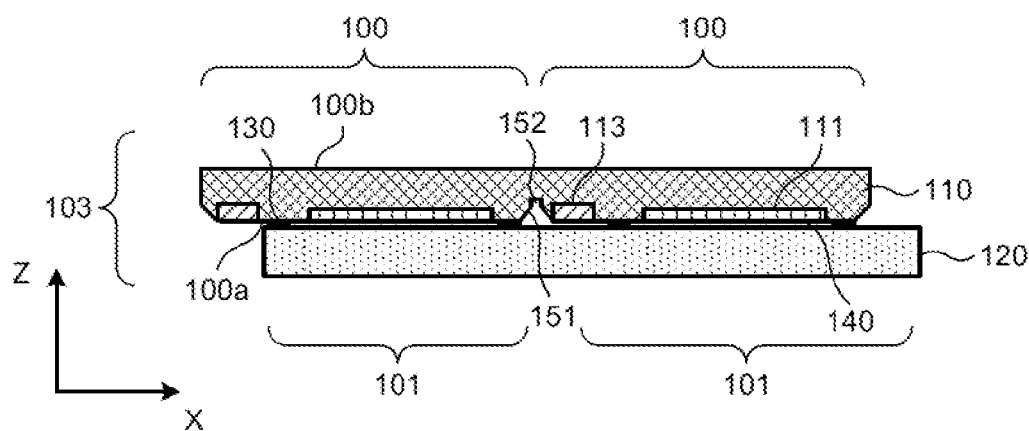
FIG. 5 is a step cross-sectional view of the lamination substrate in the manufacturing method according to the present embodiment.

Thereafter, the semiconductor wafer 110 and the mother glass substrate 120 are laminated together to manufacture a lamination structure. For this purpose, under a reduced pressure atmosphere, the semiconductor wafer 110 and the mother glass substrate 120 are disposed to face each other such that the oriented films face each other. That is, the surface 100a of the semiconductor wafer 110 faces the mother glass substrate 120, and the first groove 151 is disposed facing the mother glass substrate 120. Furthermore, after the semiconductor substrate 100 and the mother glass substrate 120 are relatively aligned, the semiconductor wafer 110 and the mother glass substrate 120 are laminated together to be cured and bonded to each other by UV radiation and heating with respect to the sealing material 130. In this way, a structure illustrated in FIG. 5 is obtained.

Here, the sealing material 130 is provided for each of the semiconductor substrates 100 and the counter substrates 101, and therefore, each of the semiconductor substrates 100 is laminated with the counter substrate 101. A lamination structure 103 in which the semiconductor wafer 110 and the mother glass substrate 120 are laminated together can be obtained. The semiconductor wafer 110 and the mother glass substrate 120 are disposed to face each other with a predetermined gap therebetween due to the sealing material 130. In the lamination structure 103, a space formed by the semiconductor substrate 100, the counter substrate 101, and the sealing material 130 is filled with the liquid crystal 140. That is, the lamination structure 103 includes a plurality of liquid crystal display elements.

(Step S10: Step of Forming Groove of Cutting Line on Back Surface of Semiconductor Substrate)

Figure 6:
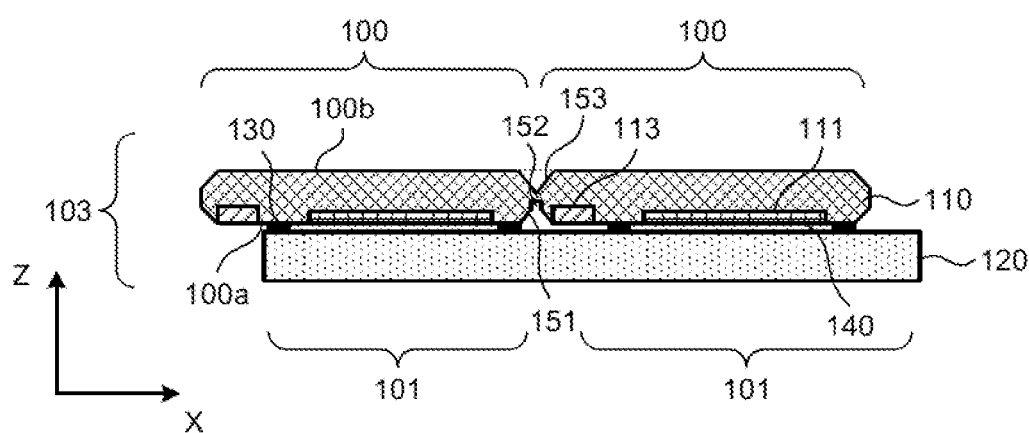
FIG. 6 is a step cross-sectional view of the lamination substrate in the manufacturing method according to the present embodiment.

Next, a second groove 153 is formed on the back surface 100b of the semiconductor wafer 110. As a result, a structure illustrated in FIG. 6 is obtained. Specifically, a plurality of second grooves 153 is formed at a predetermined pitch in parallel with the processing standard line 30 based on the processing standard line 30. In addition, a plurality of second grooves 153 is formed at a predetermined pitch in parallel with the processing standard line 31 based on the processing standard line 31. In step S3, the processing standard lines 30 and 31 are formed based on the pattern of the surface 100a. Therefore, positioning from the back surface 100b can be performed.

The second grooves 153 are formed in a lattice shape on the back surface 100b of the semiconductor substrate 100. In an XY plan view, the second groove 153 is formed at a position corresponding to the first groove 151. The second groove 153 is formed on the cutting lines 32 and 33 which are boundaries between the semiconductor wafers 110 adjacent to each other (FIG. 2). The position of the second groove 153 is aligned based on the processing standard lines 30 and 31. That is, the second groove 153 is formed on the cutting line 32 in the Y direction based on the processing standard line 30. The second groove 153 is formed on the cutting line 33 in the X direction based on the processing standard line 31. As described above, based on the processing standard lines 30 and 31 on edge sides of the semiconductor wafer 110, the semiconductor wafer 110 which is an opaque silicon substrate can be aligned surely. As a result, the second groove 153 is formed at substantially the same position as the first groove 151.

The second groove 153 has a tapered shape. The tapered shape is a cross-sectional shape in which the width of a back surface 100b side is the widest and the width becomes narrower toward a deeper position of the groove. Here, as illustrated in FIG. 6, the second groove 153 has a V-shaped cross-section. That is, the second groove 153 is a V-groove. For example, an angle at a bottom portion of the V-groove is 60 degrees or more and 90 degrees or less.

The shape of the second groove 153 can be controlled by a shape of a dicing blade used and a notch depth. For example, a dicing blade having a V-shaped blade tip is used. The V-shape angle of the blade tip is made to be from 60 degrees to 90 degrees to match the angle of the second groove 153. More specifically, a dicing blade having a blade tip in which the V-shape angle is 60 degrees is used to form the second groove 153. When the blade is repeatedly used to form the plurality of second grooves 153, the blade tip is worn away. As the second groove 153 is formed more, the angle of the blade tip becomes wider. The blade is replaced with a new one almost when the angle of the blade tip is 90 degrees. In this way, the V-shape angle of the second groove 153 can be controlled within a range of 60 degrees to 90 degrees. Of course, the angle of the blade tip and the angle of the second groove 153 are not limited to the above-described values. The dicing blade to form the second groove 153 can be the same as the dicing blade for the first groove 151.

The kerf width of the second groove 153 on the back surface 100b is preferably from 70 to 180 μm, and more preferably from 150 to 160 μm. The kerf width of the second groove 153 is a surface width of the second groove 153 on the back surface 100b. The kerf width is controlled by the height of the V-shaped blade. That is, the more deeply digging-in with the V-shaped blade tip is performed, the wider the kerf width can be. It is assumed that the shape of the second groove 153 is such that the end surface of the semiconductor substrate 100 does not come into contact with the adjacent semiconductor substrate 100 in a later dividing step (S12). The semiconductor wafer 110 is half-cut such that the second groove 153 does not reach the notch groove 152.

(Step S11: Step of Dividing Semiconductor Wafer)

Figure 7:
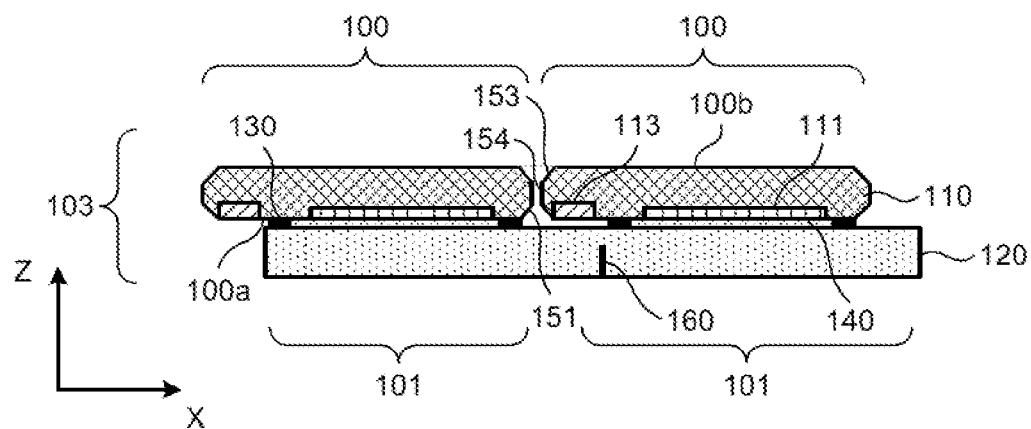
FIG. 7 is a step cross-sectional view of the lamination substrate in the manufacturing method according to the present embodiment.

Next, as illustrated in FIG. 7, the semiconductor wafer 110 is divided into an element size. For this purpose, a notch groove 154 is formed in the semiconductor wafer 110 of the lamination structure 103. The bottom portion of the second groove 153 is further cut in with the dicing blade to form the notch groove 154. In other words, the semiconductor wafer 110 is cut from the second groove 153 toward the notch groove 152. Specifically, while the dicing blade is made to abut on a position of the second groove 153 from the back surface 100b side of the semiconductor wafer 110, the bottom portion of the second groove 153 is further cut in. Then, the notch groove 154 reaches the notch groove 152 to perform dicing of the semiconductor wafer 110. The semiconductor wafer 110 is full-cut, and the semiconductor substrate 100 is divided from the adjacent semiconductor substrate 100.

When the notch groove 154 is formed, alignment is based on the processing standard lines 30 and 31. A plurality of notch grooves 154 is formed at a predetermined pitch in parallel with the processing standard line 30 based on the processing standard line 30. In addition, a plurality of notch grooves 154 is formed at a predetermined pitch in parallel with the processing standard line 31 based on the processing standard line 31. As a result, an XY position of the notch groove 154 can be matched with XY positions of the first groove 151 and the notch groove 152 with high accuracy of the position similarly to the second groove 153.

The width of the notch groove 154 is made narrower than the maximum width of the second groove 153 on the back surface 100b. In other words, the width of the notch groove 154 is narrower than the kerf width of the second groove 153. The notch groove 154 can be formed by dicing with a blade having a blade width of 50 μm. In consideration of the tolerances of the thicknesses of the semiconductor wafer 110 and the mother glass substrate 120 in addition to the R shape of the dicing blade tip used for a notching process, the processing height is set to full-cut the semiconductor wafer 110. The semiconductor substrate 100 is fixed to the mother glass substrate 120 by the sealing material 130. Therefore, even if the semiconductor wafer 110 is full-cut, the semiconductor wafer 110 does not fall off. The notch groove 154 may be formed with a blade similar to the dicing blade for the notch groove 152.

In a step of forming the first groove 151, a part of the wiring formed on the surface 100a of the semiconductor substrate 100 may be cut. For example, the wiring for inspection may be formed so as to cross the positions of the cutting lines 32 and 33. Specifically, it is assumed that short ring wiring in which a plurality of signal wires is conducted is formed at positions of the cutting lines 32 and 33. When the semiconductor substrate 100 is subjected to signal inspection, an inspection signal is supplied to the plurality of signal wires through the short ring wiring. After the inspection is performed while the semiconductor substrate 100 is in a state described above, the wiring for inspection is cut in step S4.

(Step S12: Step of Dividing Mother Glass Substrate)

Next, the mother glass substrate 120 is divided into an element size. The mother glass substrate 120, the transparent electrode, the antireflection film, and the oriented film are all transparent. Therefore, even in the lamination structure 103, it is possible to detect the position of the scribe line of the semiconductor substrate 100 via the mother glass substrate 120. The scribe groove 160 is formed on a surface of the mother glass substrate 120 not facing the semiconductor wafer 110.

When the mother glass substrate 120 is scribed, the scribe position is determined by alignment of the scribe line of the semiconductor substrate 100. On a side of the semiconductor substrate 100 where the terminal 113 exists, a surface of the terminal 113 needs to be exposed. Because of this, as illustrated in FIG. 3, the scribe groove 160 is formed at a position offset from the notch grooves 152 and 154. The scribe groove 160 in the Y direction is offset in the X direction from the position of the second groove 153. In the X direction, the scribe groove 160 is formed between the terminal 113 and the sealing material 130. Here, the offset amount is set to be from 0.7 to 1.5 mm.

Meanwhile, on a side where the terminals 113 perpendicular to each other do not exist, the scribe groove 160 of the mother glass substrate 120 is formed at the same position as the scribe line of the semiconductor substrate 100. For example, the scribe groove 160 in the X direction is formed at the position of the second groove 153. The depth of the scribe groove 160 is equal to or more than a half of the thickness of the mother glass substrate 120. The scribe groove 160 is formed, and whereby a structure illustrated in FIG. 7 is obtained.

In the present embodiment, scribe conditions such as a blade shape of the scribe, a notch depth, and a notch pressure are optimized. In addition, a crack perpendicular to the surface of the mother glass substrate 120 is formed as the scribe groove 160. Next, the lamination structure 103 in which the scribe groove 160 is formed is fixed onto the breaker stage 170 by vacuum adsorption (refer to FIG. 8). At this time, the lamination structure 103 is disposed on the breaker stage 170 such that the surface of the mother glass substrate 120 on which the scribe groove 160 is formed comes into contact with the breaker stage 170. The breaker stage 170 is made of a deferrable material, for example, rigid urethane.

Figure 8:
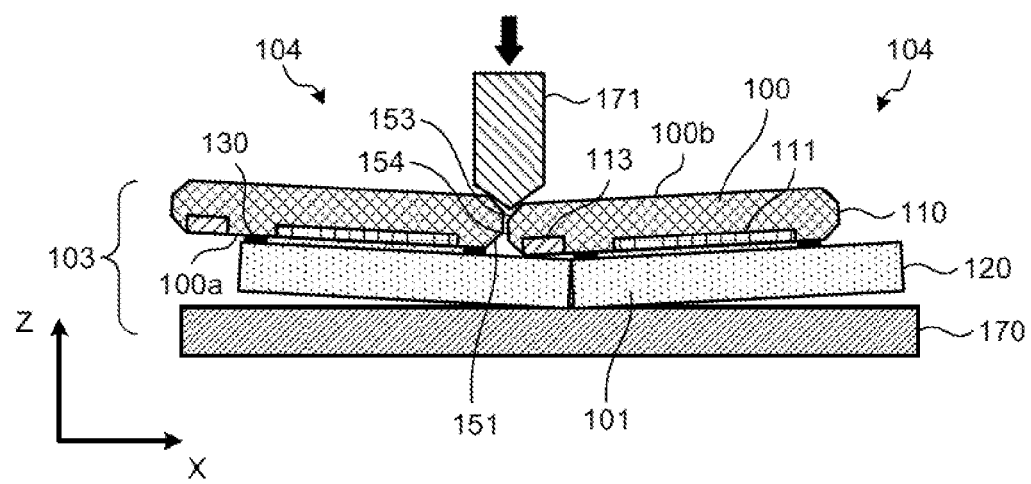
FIG. 8 is a step cross-sectional view of the lamination substrate in the manufacturing method according to the peasant embodiment.

A tip of the breaker squeegee 171 is aligned with the position of the notch groove 154 on the back surface 100b of the semiconductor substrate 100. Then, the tip of the breaker squeegee 171 is made to abut on the back surface 100b of the semiconductor substrate 100 from the upper side. As a result, the tip of the breaker squeegee 171 is inserted into the second groove 153, and abuts on the tapered surface of the second groove 153. Then, the breaker squeegee 171 is pushed to the side of the mother glass substrate 120 at predetermined pushing amount and lowering speed. As a result, as illustrated in FIG. 8, the breaker stage 170 is deformed, and the mother glass substrate 120 is cleaved. Therefore, the lamination structure 103 is divided, and whereby a lamination substrate 104 can be obtained.

Figure 9:
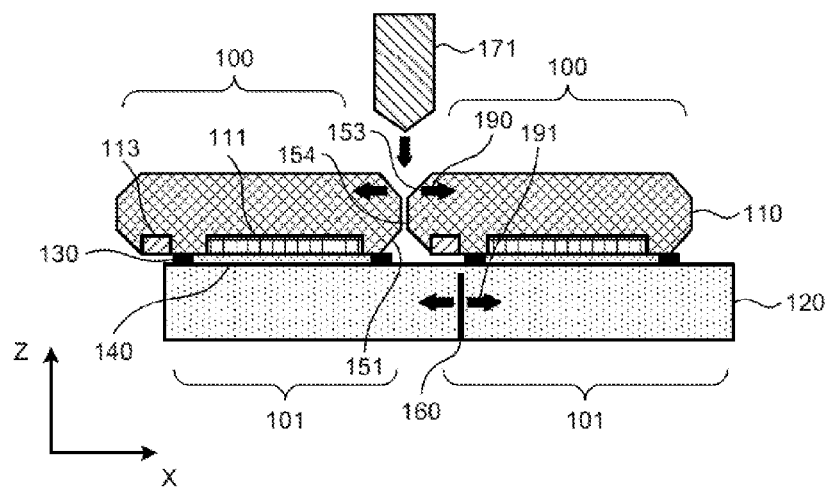
FIG. 9 is a cross-sectional view illustrating a scribe break step in the manufacturing method according to the peasant embodiment.

The breaker squeegee 171 has a sharp shape. In the present embodiment, the tip of the breaker squeegee 171 has a V-shape and the tip angle thereof is set to 135 degrees. The tip angle of the breaker squeegee 171 is made larger than the angle of the second groove 153. As a result, when the tip of the breaker squeegee 171 abuts on the second groove 153, as illustrated in FIG. 9, a force 190 opening in a horizontal direction (X direction) starts to be applied. That is, a force of the breaker squeegee 171 in a Z direction to push the semiconductor wafer 110 to the side of the mother glass substrate 120 is converted into the force 190 in the X direction on the tapered surface of the second groove 153. Then, the force 190 in the horizontal direction is applied to the semiconductor wafer 110, and whereby a force 191 in the horizontal direction is also applied to the mother glass substrate 120 connected with the semiconductor wafer 110 via the sealing material 130. The force 191 in the horizontal direction acts in a direction in which the scribe groove 160 opens. Therefore, a bending amount of the mother glass substrate 120 in a vertical direction can be suppressed. As a result, a deforming amount of the breaker stage 170 becomes small. Therefore, advantageously, the semiconductor substrates 100 adjacent to each other can be prevented from coming into contact with each other, and the semiconductor substrate 100 and the mother glass substrate 120 can be prevented from coming into contact with each other. An amount of crack of the substrate can be reduced. Circuit failure and contact failure of the terminal can be suppressed. A yield can be improved to enhance productivity.

As described above, at the position of the tapered second groove 153, the breaker squeegee 171 is pushed to the side of the mother glass substrate 120. In this way, the force in the thickness direction (Z direction) applied from the breaker squeegee 171 is converted into the forces 190 and 191 in the horizontal direction (X direction in FIG. 9). Then, the deforming amount of the breaker stage 170 can be small. Therefore, the amount of crack of the substrate can be reduced to enhance productivity. The tip angle of the breaker squeegee 171 is made larger than the angle of the second groove 153, and whereby the force 190 in the horizontal direction can be easily generated. In addition, the breaker squeegee 171 is pushed in such a pushing amount and a lowering speed that corner portions of the semiconductor substrate 100 do not come into contact with the mother glass substrate 120 when the mother glass substrate 120 is cleaved. This can prevent the substrate from being damaged and connection failure and circuit failure from occurring. Then, a yield can be improved to enhance productivity.

By this dividing step, a plurality of lamination substrates 104 can be obtained from one lamination structure 103. When the lamination substrate 104 is separated from the lamination structure 103, the first groove 151 and the second groove 153 become chamfered portions of the semiconductor substrate 100. That is, the first groove 151 and the second groove 153 become tapered surfaces obtained by chamfering corners of a side end surface of the semiconductor substrate 100. The tip of the breaker squeegee 171 is not limited to a V-shape.

Furthermore, the first groove 151 is formed on the surface 100a of the semiconductor substrate 100. Therefore, when the breaker squeegee 171 is pushed in to scribe the mother glass substrate 120, the corner portions of the semiconductor substrate 100 can be prevented from coming into contact with the surface of the mother glass substrate 120. In addition, the second groove 153 is formed on the back surface 100b of the semiconductor substrate 100. Therefore, when the breaker squeegee 171 is pushed in to scribe the mother glass substrate 120, the corner portions of the semiconductor substrate 100 adjacent to each other can be prevented from coming into contact with each other. This can prevent broken pieces of the corner portions of the semiconductor substrate 100 and the counter substrate 101 from damaging the terminal 113, a circuit around the terminal 113, or the like. This can reduce occurrence of connection failure and circuit failure to improve a yield. Therefore, productivity can be enhanced.

Here, the pushing amount of the breaker squeegee 171 is from 40 to 100 µm, and the lowering speed is from 140 to 160 m/s. That is, the scribe groove 160 is provided such that the mother glass substrate 120 is cleaved when the pushing amount of the breaker squeegee 171 is from 40 to 100 µm. When the scribe groove 160 is deep, the pushing amount can be small. Then, the deforming amount of the breaker stage 170 can be small. This can prevent the corner portions of the semiconductor substrate 100 from coming into contact with the surface of the mother glass substrate 120 or the like. Therefore, the semiconductor substrate 100 and the counter substrate 101 can be prevented from being damaged to enhance productivity.

The lamination substrate 104 manufactured as described above is a liquid crystal display element. An external control device or the like is connected to the terminal 113 of the lamination substrate 104 by wire bonding, an anisotropic conductive film, or the like. As a result, the liquid crystal 140 is driven in accordance with a voltage supplied to the pixel electrode. Light which has passed through the counter substrate 101 and the liquid crystal 140 from the outside is reflected on the pixel electrode 111. An amount of light to be reflected on the pixel electrode 111 and emitted to the outside changes depending on the state of the liquid crystal 140. A desired image can be displayed in accordance with a control, signal from an external control device. Such a reflection-type liquid crystal display element is suitable for a projector which projects an image. Furthermore, the reflection-type liquid crystal display element can be used for a head-up display mounted on a vehicle such as an automobile.

STRUCTURE EXAMPLE

Figure 10:
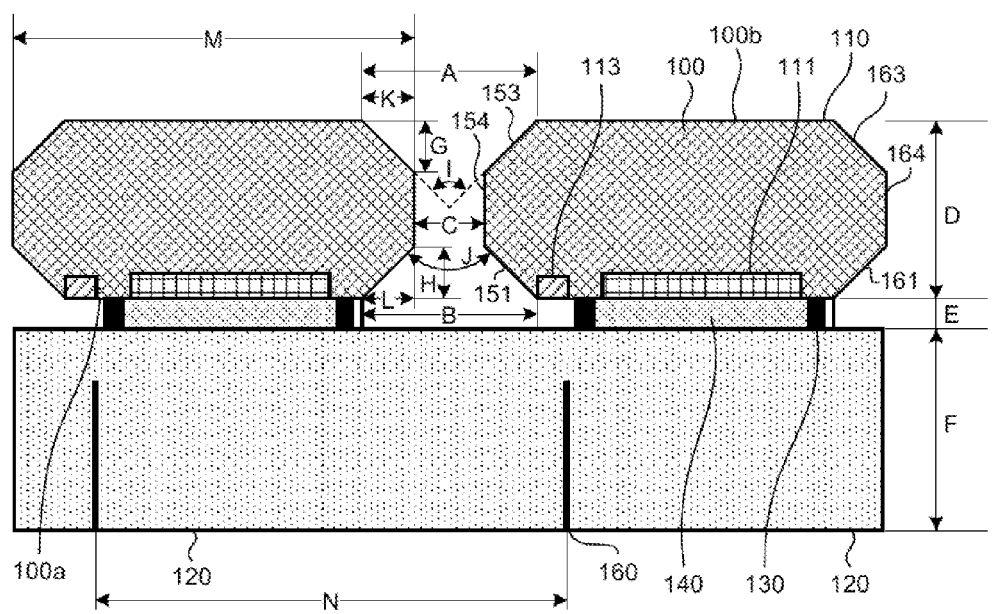
FIG. 10 is a cross-sectional view illustrating an example of a structure and a size of the lamination substrate.
Figure 11:
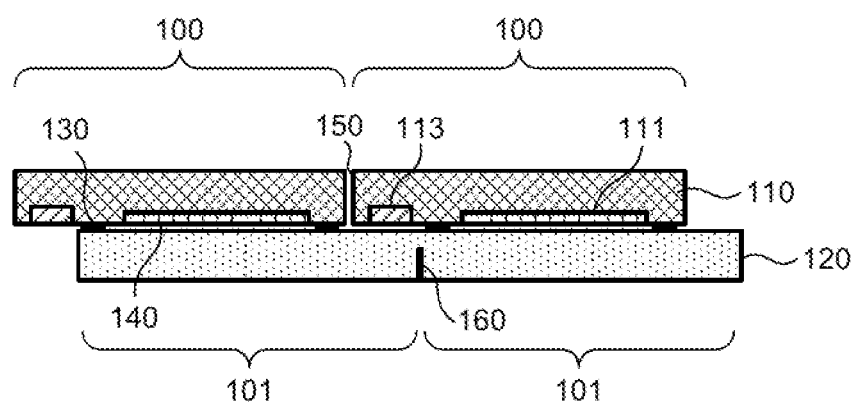
FIG. 11 is a step cross-sectional view for illustrating a problem of a manufacturing method in which a substrate is cut after lamination.
Figure 12:
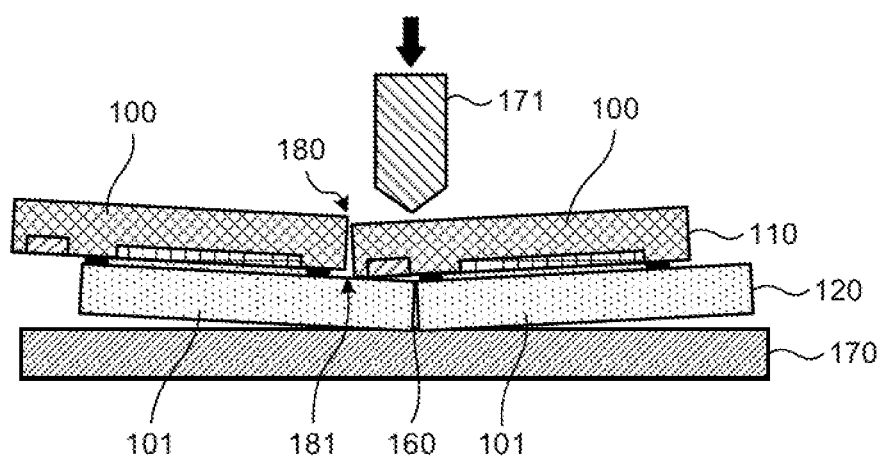
FIG. 12 is a step cross-sectional view for illustrating the problem of the manufacturing method in which the substrate is cut after lamination.

Here, a structure of the lamination structure 103 will be described with reference to FIG. 10. FIG. 10 is a view for illustrating a specific example of the structure of the lamination structure 103, and a cross-sectional view for illustrating the structure after forming the scribe groove 160. Of course, a size example described below is a size representing an example of the liquid crystal display element, and the size of the liquid crystal display element is not limited thereto.

A kerf width A of the second groove 153 provided on the back surface 100b of the semiconductor substrate 100 is from 70 to 180 µm. The kerf width A of the second groove 153 is made wide in order to easily insert the tip of the breaker squeegee 171. A kerf width B of the first groove 151 provided on the surface 100a of the semiconductor substrate 100 is from 80 to 200 µm. An upper limit value of the kerf width B of the first groove 151 is limited such that the first groove 151 does not reach the terminal 113. The kerf width B of the first groove 151 may be made wider than the kerf width A of the second groove 153. A width C of each of the notch grooves 152 and 154 is from 40 to 50 µm.

An angle J of the first groove 151 is from 60 to 90 degrees as described above. An angle I of the second groove 153 is from 60 to 90 degrees as described above. After the notch groove 154 is formed to separate the semiconductor substrate 100, the first groove 151 becomes a chamfered portion 161, and the second groove 153 becomes a chamfered portion 163. The chamfered portion 161 is a tapered inclined surface formed on the side of the surface 100a of the semiconductor substrate 100. The chamfered portion 163 is a tapered inclined surface formed on the side of the back surface 100b of the semiconductor substrate 100. The corner portions of the semiconductor substrate 100 are chamfered by the chamfered portions 161 and 163. It is assumed that a portion corresponding to the notch groove 154 is a cut surface 164. The cut surface 104 is formed substantially perpendicularly to the surface 100a and the back surface 100b of the semiconductor substrate 100. The cut surface 164 is provided between the chamfered portions 161 and 163 in the side end surface of the semiconductor substrate 100.

The shapes of the chamfered portions 161 and 163 at the corner portions of the semiconductor substrate 100 are determined depending on the angle J of the first groove 151 and the angle I of the second groove 153. The larger the angle J of the first groove 151 and the angle I of the second groove 153 are, the gentler the tapered shapes of the chamfered portions 161 and 163 can be.

A depth H of the chamfered portion 161 in the thickness direction of the semiconductor substrate 100 and a surface width L of the chamfered portion 161 are from 15 to 140 µm and from 15 to 80 µm, respectively. For example, when the lower limit of the kerf width B of the first groove 151 is 80 µm, and the width C of the notch groove 152 is 50 µm, the surface width L of the chamfered portion 161 is (80−50)/2, that is, 15 µm. When the surface width L of the chamfered portion 161 is 15 µm, and the angle J of the first groove 151 is 90 degrees, the depth H of the chamfered portion 161 is the lower limit value, 15 µm. When the upper limit of the kerf width B of the first groove 151 is 200 µm, and the width C of the notch groove 152 is 40 µm, the surface width L of the chamfered portion 161 is (200−40)/2, that is, 80 µm. When the surface width L of the chamfered portion 161 is 80 µm, and the angle J of the first groove 151 is 60 degrees, the depth H of the chamfered portion 161 is the upper limit value, 140 µm. A depth G of the chamfered portion 163 in the thickness direction of the semiconductor substrate 100 and a surface width K of the chamfered portion 163 are from 10 to 110 µm and from 10 to 70 µm, respectively.

A thickness D of the semiconductor substrate 100 is 725 µm, and the tolerance of the thickness D is ±25 µm. Each of a thickness E of the liquid crystal 140 and the height of the sealing material 130 is from 1 to 3 µm. A thickness F of the mother glass substrate 120 is 925 µm, and the tolerance of the thickness F is ±25 µm. A size M of the semiconductor substrate 100 is 12.0 mm. A size N of the counter substrate 101 is 12.0 mm.

In the completed lamination substrate 104, the depth H of the chamfered portion 161 is different from the depth G of the chamfered portion 163. The second groove 153 is required at least to have a width into which the tip of the breaker squeegee 171 can be inserted. Therefore, the second groove 153 may not be formed in such a strict manner as the first groove 151. When the second groove 153 is formed, it is not necessary to strictly control the groove width and the groove depth. This makes the manufacturing step simple. In order to prevent the semiconductor substrate 100 from being damaged, the kerf width B of the first groove 151, the depth H of the chamfered portion 161, and the surface width L of the chamfered portion 161 are preferably made large. That is, at the time of cutting as illustrated in FIG. 8, the first groove 151 is formed such that the corner portions of the semiconductor substrate 100 do not come into contact with the mother glass substrate 120. Therefore, from the viewpoint of preventing the semiconductor substrate 100 from being damaged, the depth H of the chamfered portion 161 is preferably made larger than the depth G of the chamfered portion 163. In other words, the depth of the first groove 151 is made deeper than that of the second groove 153. As a result, at the time of cutting as illustrated in FIG. 8, the corner portions of the semiconductor substrate 100 can be prevented from coming into contact with the mother glass substrate 120. There is a limitation that the kerf width B of the first groove 151 and the depth H of the chamfered portion 161 are set such that the first groove 151 does not reach the terminal 113. In addition, when the kerf width A of the second groove 153 is large, the breaker squeegee 171 can be easily inserted into the second groove 153. Therefore, from the viewpoint of inserting the breaker squeegee 171 into the second groove 153, the kerf width A of the second groove 153 is preferably from 150 to 180 µm. In addition, when the kerf width A of the second groove 153 is made large, the depth G of the chamfered portion 163 is made deeper than the depth H of the chamfered portion 161. In other words, the depth of the second groove 153 is made deeper than that of the first groove 151. As a result, the semiconductor substrates 100 can be separated from each other without coming into contact with each other.

After step S4 and before step S10, the oriented film is formed. As a result, the completed lamination substrate 104 has a structure in which the oriented film remains on the tapered surface of the chamfered portion 161. When the oriented film is formed across the cutting lines 32 and 33, the lamination substrate 104 has a structure in which the oriented film remains in the chamfered portion 161. In addition, the notch groove 154 is formed after forming the oriented film. Therefore, the oriented film is removed in the cut surface 164.

The invention accomplished fop the present inventor has been described above based on the embodiment. Needless to say, the present invention is not limited to the embodiment described above, and can be variously modified within a range not departing from the gist of the invention.

As described above, the lamination substrate and the manufacturing method according to the present invention are useful in a case where the first substrate and the second substrate are laminated together using an adhesive. In particular, the lamination substrate and the manufacturing method are suitable for a case where a lamination substrate having a high productivity is manufactured.

According to the present invention, it is possible to provide a lamination substrate having a high productivity and a method of manufacturing the lamination substrate.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A manufacturing method for manufacturing a lamination substrate in which a first substrate part and a second substrate part are laminated together using a first mother substrate including a plurality of first substrate parts and a second mother substrate including a plurality of second substrate parts, the manufacturing method comprising:
   a step of forming the first substrate part including a terminal in the first mother substrate;
   a step of forming a tapered first groove on a first surface provided with the terminal of the first mother substrate;
   a step of forming a notch groove having a width narrower than the maximum width of the first groove in a bottom portion of the first groove;
   a step of providing an adhesive in at least one of the first substrate part and the second substrate part;
   a step of laminating the first mother substrate to the second mother substrate using the adhesive such that the first surface is disposed on a side of the second mother substrate and the terminal is disposed outside the adhesive;
   a step of forming a tapered second groove at a position corresponding to the first groove on a second surface opposite to the first surface of the first mother substrate;
   a step of separating the respective first substrate parts by cutting the first mother substrate from the second groove toward the notch groove;
   a step of providing a scribe groove on a surface of the second mother substrate not facing the first substrate part; and
   a step of separating the respective second substrate parts by cutting the second mother substrate along the scribe groove, wherein a depth of the first groove in a thickness direction of the first substrate part is different from a depth of the second groove in the thickness direction of the first substrate part, and the depth of the first groove is deeper than the depth of the second groove.

2. A lamination substrate comprising:

a first substrate;

a second substrate disposed to face a first surface of the first substrate;

an adhesive disposed between the first substrate and the second substrate to laminate the first substrate and the second substrate together; and a terminal formed on a side of the first surface of the first substrate and disposed outside the adhesive, wherein a side end surface of the first substrate includes:

a first chamfered portion provided on the side of the first surface;

a second chamfered portion provided on the side of a second surface opposite to the first surface and having a depth in a thickness direction of the first substrate different from that of the first chamfered portion; and a cut surface disposed between the first chamfered portion and the second chamfered portion, a length of the first substrate in a direction perpendicular to the thickness direction is the same as that of the second substrate, and a side end of the second substrate is disposed between the terminal and the adhesive closer to the terminal, wherein the first substrate and the second substrate have a same length respectively in the direction perpendicular to the thickness direction, the side end of the second substrate is disposed between the terminal and the adhesive closer to the terminal, and the depth of the first chamfered portion in the thickness direction of the first substrate is larger than the depth of the second chamfered portion in the thickness direction of the first substrate.

* * * * *